US010393861B2

(12) United States Patent
Kamimura

(10) Patent No.: US 10,393,861 B2
(45) Date of Patent: Aug. 27, 2019

(54) FREQUENCY MODULATION CIRCUIT, FM-CW RADAR, AND HIGH-SPEED MODULATION RADAR

(71) Applicant: Mitsubishi Electric Corporation, Chiyoda-ku (JP)

(72) Inventor: Tatsuya Kamimura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/078,390

(22) PCT Filed: Dec. 21, 2016

(86) PCT No.: PCT/JP2016/088203
§ 371 (c)(1),
(2) Date: Aug. 21, 2018

(87) PCT Pub. No.: WO2017/175427
PCT Pub. Date: Oct. 12, 2017

(65) Prior Publication Data
US 2019/0049557 A1 Feb. 14, 2019

(30) Foreign Application Priority Data

Apr. 5, 2016 (JP) .................................. 2016-076029

(51) Int. Cl.
*G01S 7/35* (2006.01)
*G01S 7/40* (2006.01)
(Continued)

(52) U.S. Cl.
CPC ........ *G01S 7/40* (2013.01); *G01S 7/35* (2013.01); *G01S 7/4008* (2013.01); *G01S 13/34* (2013.01);
(Continued)

(58) Field of Classification Search
CPC ........... G01S 7/40; G01S 7/4008; G01S 13/34
(Continued)

(56) References Cited

U.S. PATENT DOCUMENTS 4,837,556 A * 6/1989 Matsushita ............ B64G 1/428
340/531
6,330,391 B1 * 12/2001 Kurihara ................ H04N 9/793
386/203

(Continued)

FOREIGN PATENT DOCUMENTS

EP       3 203 260 A1    8/2017
JP       2002-529747 A   9/2002
(Continued)

OTHER PUBLICATIONS

International Search Report dated Feb. 7, 2017 in PCT/JP2016/088203 filed Dec. 21, 2016.

(Continued)

*Primary Examiner* — Frank J McGue
(74) *Attorney, Agent, or Firm* — Oblon, McClelland, Maier & Neustadt, L.L.P.

(57) ABSTRACT

A frequency modulation circuit includes a VCO, a DIV, a MIX, a single-phase differential converter, and a signal processing circuit. The signal processing circuit performs differential arithmetic processing of an intermediate frequency signal with a program of a microcomputer according to a quadrature demodulation scheme and, thereafter, measures a frequency from phase information, performs n-th order polynomial (n is an integer equal to or larger than 2) approximation on time-frequency data of an IF signal output by a chirp modulation control voltage after inverse function correction, and performs modulation correction for correcting a time error.

30 Claims, 14 Drawing Sheets

(51) Int. Cl.
*G01S 13/34* (2006.01)
*H03L 7/085* (2006.01)

(52) U.S. Cl.
CPC .......... *G01S 13/343* (2013.01); *G01S 13/345* (2013.01); *H03L 7/085* (2013.01); *G01S 2007/358* (2013.01)

(58) Field of Classification Search
USPC ........................................................ 342/173
See application file for complete search history.

(56) References Cited

U.S. PATENT DOCUMENTS

| | | | |
|---|---|---|---|
| 6,621,449 | B1 | 9/2003 | Kunert |
| 2004/0102170 | A1 | 5/2004 | Jensen et al. |
| 2009/0033538 | A1 | 2/2009 | Winkler |
| 2009/0040084 | A1 | 2/2009 | Frederick et al. |
| 2009/0224963 | A1 | 9/2009 | Nakanishi |
| 2012/0093202 | A1* | 4/2012 | Tsuchida .................. H04B 1/38 375/219 |
| 2012/0295564 | A1* | 11/2012 | Chen ........................ H04B 1/28 455/293 |
| 2013/0050013 | A1 | 2/2013 | Kobayashi et al. |
| 2015/0341044 | A1* | 11/2015 | Nakamura .......... H03M 1/0624 341/118 |
| 2018/0031691 | A1 | 2/2018 | Kurashige |

FOREIGN PATENT DOCUMENTS

| | | |
|---|---|---|
| JP | 2007-298317 A | 11/2007 |
| JP | 2008-131298 A | 6/2008 |
| JP | 2011-127923 A | 6/2011 |
| JP | 2013-47617 A | 3/2013 |
| WO | WO 2016/051438 A1 | 4/2016 |
| WO | WO 2016/132520 A1 | 8/2016 |

OTHER PUBLICATIONS

European Search Report dated Apr. 8, 2019, issued in European Patent Application No. 16897979.7.

European Office Action dated May 6, 2019, issued in European Patent Application No. 16897979.7.

Chinese Office Action dated Jun. 10, 2019, issued in Chinese Patent No. 201680084240.1 (with English translation).

* cited by examiner

FREQUENCY MODULATION CIRCUIT, FM-CW RADAR, AND HIGH-SPEED MODULATION RADAR

FIELD

The present invention relates to a frequency modulation circuit of a radar that performs frequency modulation, an FM-CW radar, and a high-speed modulation radar.

BACKGROUND

A conventional FM-CW radar adopting a Frequency Modulated-Continuous Waves (FM-CW) scheme, a circuit configuration of which is relatively simple, measures a frequency of a beat signal of a frequency-modulated transmission signal and a reception signal reflected from a target object, and calculates a relative distance and relative speed with respect to the target object. A Voltage Controlled Oscillator (VCO) is provided in the conventional FM-CW radar adopting the FM-CW scheme.

The VCO outputs an oscillation frequency signal frequency-modulated according to a modulation control voltage. The oscillation frequency signal is requested to have high modulation linearity. However, because the VCO is a semiconductor device that controls a frequency with a voltage, the VCO shows a nonlinear frequency characteristic with respect to the voltage. The frequency characteristic of the VCO deviates according to individual variability or temperature characteristics. Therefore, in a shipment inspection process, work for measuring the oscillation frequency signal of the VCO and adjusting the oscillation frequency signal concerning modulation linearity is essential. The adjusting work is a hindrance to a reduction of an inspection time for mass production.

To obtain the modulation linearity of the VCO, the conventional FM-CW radar represented by Patent Literature 1 corrects the oscillation frequency signal of the VCO according to a Look Up Table (LUT) for modulation control voltage, or is provided with a mechanism for measuring the oscillation frequency signal of the VCO on a frequency modulation circuit to perform feedback control, to thereby cope with characteristic change of the VCO due to aged deterioration after shipment.

CITATION LIST

Patent Literature

Patent Literature 1: Japanese Patent Application Laid-Open No. 2007-298317

SUMMARY

Technical Problem

The conventional FM-CW radar represented by Patent Literature 1 performs frequency division of the oscillation frequency signal of the VCO with a divider (DIV), which is a frequency divider, and thereafter converts an intermediate frequency (IF) signal, which is a signal having an intermediate frequency down-converted using a local signal, into a digital signal with an Analog to Digital Converter (ADC). Thereafter, the FM-CW radar measures an instantaneous frequency with a microcomputer from instantaneous phase information of the IF signal according to a quadrature demodulation scheme.

The oscillation frequency of the VCO is calculated from a frequency and a frequency division number of the local signal. However, there is a problem in that time-frequency data measured in the quadrature demodulation scheme is poor in measurement accuracy and high linearity of frequency modulation cannot be obtained even when the feedback control is performed.

The present invention has been devised in view of the above, and an object of the present invention is to obtain a frequency modulation circuit that can obtain high linearity of frequency modulation.

Solution to Problem

A frequency modulation circuit according to an aspect of the present invention includes: a digital-analog converter to output modulation control time-dependent voltage data; a voltage control oscillator to oscillate, based on the modulation control time-dependent voltage data output from the digital-analog converter, an oscillation frequency signal; a frequency divider to perform frequency division of the oscillation frequency signal of the voltage control oscillator and output the oscillation frequency signal; a frequency converter to down-convert a frequency division signal output from the frequency divider; a single-phase differential converter to convert an intermediate frequency signal of single-phase output from the frequency converter into differential signals and output the differential signals; an analog-digital converter to convert, concerning the differential signals output from the single-phase differential converter, analog signals of the differential signals into digital signals; and a signal processing circuit to perform frequency measurement based on the differential signals of the analog-digital converter, update the modulation control time-dependent voltage data based on the measured frequency, and correct a time error of the oscillation frequency signal of the voltage control oscillator.

Advantageous Effects of Invention

According to the present invention, there is an effect that it is possible to obtain high linearity of frequency modulation.

DESCRIPTION OF EMBODIMENTS

A frequency modulation circuit, an FM-CW radar, and a high-speed modulation radar according to an embodiment of the present invention are explained in detail below with reference to the drawings. Note that the present invention is not limited by this embodiment.

Embodiment

Figure 1:
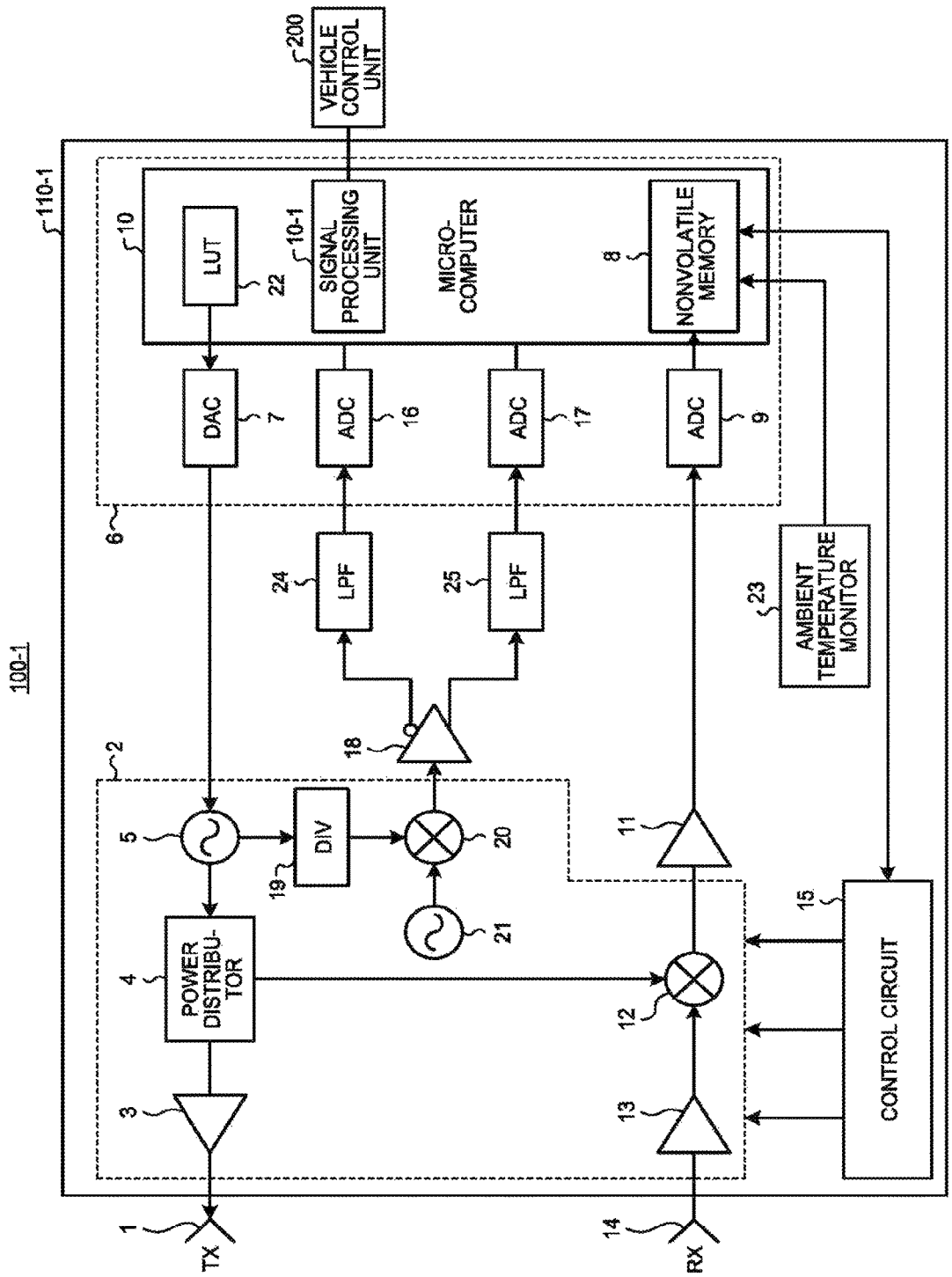
FIG. 1 is a diagram illustrating a frequency modulation circuit of an FM-CW radar according to an embodiment of the present invention.

FIG. 1 is a diagram illustrating a frequency modulation circuit of an FM-CW radar according to an embodiment of the present invention. An FM-CW radar 100-1 illustrated in FIG. 1 includes a frequency modulation circuit 110-1, a transmission antenna 1 connected to the frequency modulation circuit 110-1, and a reception antenna 14 connected to the frequency modulation circuit 110-1.

The frequency modulation circuit 110-1 includes: a high-frequency circuit 2 connected to the transmission antenna 1 and the reception antenna 14; and a signal processing circuit 6 that generates a triangular wave voltage signal, which is a modulation control voltage based on a modulated signal to be output from the high-frequency circuit 2, and outputs the triangular wave voltage signal to a VCO 5 of the high-frequency circuit 2. The frequency modulation circuit 110-1 includes a single-phase differential converter 18, a baseband amplifier circuit 11, a Low Pass Filter (LPF) 24, an LPF 25, a control circuit 15, and an ambient temperature monitor 23.

The high-frequency circuit 2 includes: the VCO 5 that generates an oscillation frequency signal, which is a modulated signal subjected to frequency modulation in accordance with a frequency control voltage transmitted from the signal processing circuit 6; and a power distributor 4 that outputs most of an output f the VCO 5 to an amplifier 3 and outputs the remaining output to a mixer (MIX) 12, which is a frequency converter, as a local signal.

The high-frequency circuit 2 includes: an amplifier 3 that amplifies an output of the power distributor 4 and outputs the output to the transmission antenna 1; a low-noise amplifier 13 that amplifies a reception signal received by the reception antenna 14; and the MIX 12 that down-converts, with a local signal, the signal amplified by the low-noise amplifier 13 into an IF signal and outputs the IF signal.

The high-frequency circuit 2 includes: a DIV 19 that performs frequency division of the oscillation frequency signal of the VCO 5 and outputs the oscillation frequency signal; a reference frequency generator 21 that outputs a local signal; and a MIX 20 that mixes the frequency division signal output from the DIV 19 and the local signal output from the reference frequency generator 21, down-converts, with the local signal, the frequency division signal into an IF signal and outputs the IF signal. A frequency of the IF signal is equivalent to a frequency of a difference between a frequency of the frequency division signal and a frequency of the local signal.

The elements of the high-frequency circuit are configured by Microwave Monolithic ICs (MMICs).

The single-phase differential converter 18 converts a single-phase IF signal, that is, a single-end signal output from the MIX 20 into differential signals and outputs the differential signals. The LPF 25 reduces unnecessary waves and noise of a positive phase-side differential signal output from the single-phase differential converter 18 and outputs the positive phase-side differential signal. The LPF 24 reduces unnecessary waves and noise of an opposite phase-side differential signal output from the single-phase differential converter 18 and outputs the opposite phase-side differential signal. The baseband amplifier circuit 11 amplifies the output signal of the MIX 12 and outputs the amplified signal as a reception signal.

The output signal of the LPF 24 is input to an ADC 16 in the signal processing circuit 6. The output signal of the LPF 25 is input to an ADC 17 in the signal processing circuit 6. The output signals are used for update of data for a triangular wave voltage signal in a LUT 22.

The signal processing circuit 6 includes: a microcomputer 10, which is a main circuit unit that mainly performs transmission processing and measurement processing; and a Digital to Analog Converter (DAC) 7, which is a digital-analog converter that converts a triangular wave voltage signal transmitted from the microcomputer 10 into an analog signal and outputs the analog signal to the VCO 5 of the high-frequency circuit 2.

The signal processing circuit 6 includes: the ADC 16 that converts the output signal of the LPF 24 into a digital signal; the ADC 17 that converts the output signal of the LPF 25 into a digital signal; and an ADC 9 that converts the reception signal output from the baseband amplifier circuit 11 into a digital signal and outputs the digital signal to the microcomputer 10.

The microcomputer 10 includes the LUT 22 that stores data for a triangular wave voltage signal given to the VCO 5 and a nonvolatile memory 8. An ambient temperature monitor 23 that measures an ambient temperature of the microcomputer 10 is connected to the microcomputer 10.

The control circuit 15 controls, with the microcomputer 10, various control voltages supplied to the MMICs in the high-frequency circuit 2. Specifically, the MMICs in the high-frequency circuit 2 have variations depending on manufacturing lots. Therefore, control voltage values adjusted and determined for each of the MMICs are stored in the nonvolatile memory in the microcomputer 10. During actual operation, the microcomputer 10 reads out the control voltage values from the nonvolatile memory 8 and supplies the control voltage values to the MMICs in the high-frequency circuit 2 via the control circuit 15.

The operation of the FM-CM radar 100-1 is explained below.

The VCO 5 generates, on the basis of the triangular wave voltage signal output from the signal processing circuit 6, an FM-CW signal, which is an oscillation frequency signal of high-frequency that includes a rising modulated signal, a frequency of which rises in a fixed period, and a falling modulated signal, a frequency of which falls in the fixed period.

The FM-CM signal is input to the power distributor 4. Most of the FM-CW signal is supplied to the transmission antenna 1. A millimeter-wave radio wave is irradiated from the transmission antenna 1 toward a target object. The remaining FM-CM signal is supplied to the MIX 12 as a local signal.

A reflected wave reflected on the target object is captured by the reception antenna 14 and input to the MIX 12 as a reception signal. The MIX 12 mixes the reception signal input from the reception antenna 11 and the local signal supplied from the power distributor 4, and outputs a beat signal having a frequency equivalent to a frequency difference between the signals. The beat signal is amplified to an appropriate level by the baseband amplifier circuit 11 and input to the microcomputer 10 via the ADC 9.

The microcomputer 10 includes a signal processing unit 10-1 that calculates a distance to the target object and relative speed from a frequency in a rising modulation period and a frequency in a falling modulation period in the input beat signal, and outputs relative distance information on the distance to the target object and information on the relative speed with respect to the target object. Note that these kinds of information output from the signal processing unit 10-1 are transmitted to a vehicle control unit 200 provided in a vehicle mounted with the FM-CW radar 100-1. The vehicle control unit 200 has a function of collectively controlling the operation of the vehicle mounted with the FM-CW radar 100-1. The vehicle control unit 200 performs, based on these kinds of information, processing such as clutter removal and target identification.

On the other hand, the frequency of the FM-CW signal from the VCO 5 is reduced to a frequency of one fraction of an integer by the DIV 19 and input to the MIX 20.

In the MIX 20, the frequency division signal output from the DIV 19 and the local signal output from the reference frequency generator 21 are mixed and an IF signal is output.

The IF signal is converted into differential signals by the single-phase differential converter 18. After unnecessary waves and noise are removed from the differential signals by the LPF 24 and the LPF 25, the differential signals are input to the microcomputer 10 via the ADC 16 and the ADC 17.

The microcomputer 10 measures, according to the quadrature demodulation scheme, a frequency from phase information of the IF signal, performs correction processing using a result of the measurement, calculates a voltage table necessary for securing modulation linearity of the frequency of the oscillation frequency signal, and updates the LUT 22 for a control voltage. Consequently, data for a triangular wave voltage signal output in the next cycle to the VCO 5 is updated. The updated data for the triangular wave voltage signal is converted into an analog signal, which is modulation control time-dependent voltage data, and input to the VCO 5 by the DAC 7.

Note that, as for an initial value of modulation control time-dependent voltage data, predetermined default chirp data is stored in the microcomputer 10 and output from the microcomputer 10, and the default chirp data is not output from when the LUT 22 is updated after a frequency is measured.

Correction processing for obtaining modulation linearity of the VCO 5 is explained.

Figure 2:
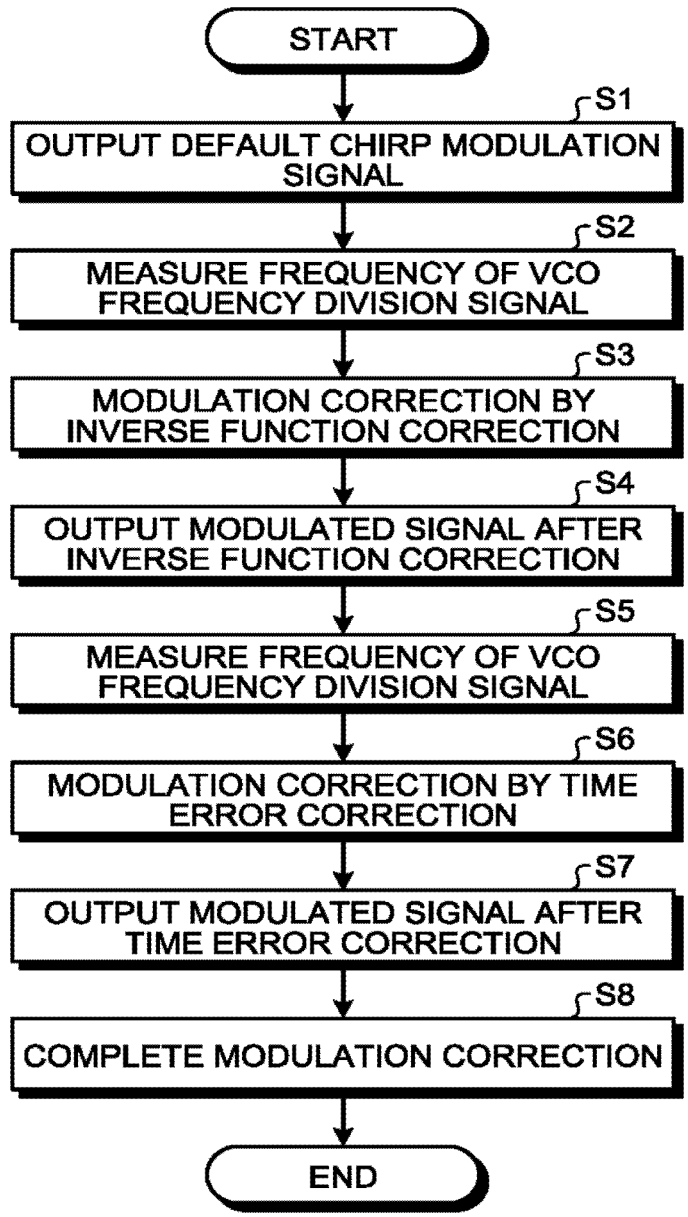
FIG. 2 is a flowchart illustrating a modulation correcting operation in a microcomputer illustrated in FIG. 1.
Figure 3:
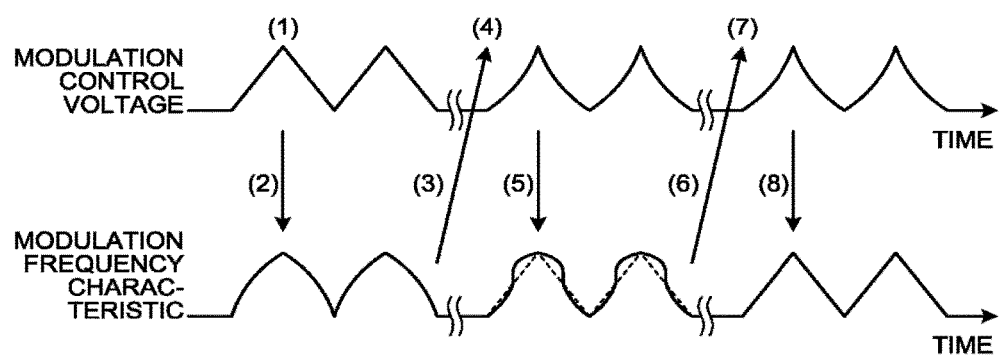
FIG. 3 is a timing chart for explaining the modulation correcting operation in the microcomputer illustrated in FIG. 2.

FIG. 2 is a flowchart illustrating a modulation correcting operation in the microcomputer illustrated in FIG. 1. FIG. 3 is a timing chart for explaining the modulation correcting operation in the microcomputer illustrated in FIG. 2. A waveform of a modulation control voltage is illustrated on the upper side of FIG. 3. A modulation frequency characteristic is illustrated on the lower side of FIG. 3. Signs (1) to (8) illustrated in FIG. 3 correspond to numbers S1 to S8 illustrated in FIG. 2.

The microcomputer 10 outputs a modulation control voltage of fault chirp, whereby the VCO 5 outputs a modulated signal of default chirp corresponding to the modulation control voltage (S1). The microcomputer 10 measures a frequency of a first-time VCO frequency division signal (S2). When the LUT 22 is updated, voltage-frequency data corresponding to the default chip data is subjected to n-th order polynomial approximation (n is an integer equal to or larger than 2), for example, cubic function approximation. A voltage table necessary for securing linearity is calculated from a result of the n-th order polynomial approximation. In this calculation, an inverse function thereof is used for correction and the modulation correction is performed (S3).

The microcomputer 10 outputs a modulation control voltage after the inverse function correction, whereby the VCO 5 outputs a modulated signal corresponding to the modulation control voltage (S4). The microcomputer 10 measures frequencies of second and subsequent-time VCO frequency division signals (S5). The microcomputer 10 subjects time-frequency data to the n-th order polynomial approximation, for example, the cubic function approximation. When the LUT 22 is updated for the second and subsequent times, the microcomputer 10 calculates a time error with respect to an ideal frequency straight line and performs correction of time data. In this calculation, the time error is used for correction and the modulation correction is performed (S6). The microcomputer 10 outputs a modulation control voltage after the time error correction, whereby the VCO 5 outputs a modulated signal corresponding to the modulation control voltage (S7). The modulation correction is completed (S8). The modulation frequency is corrected to a waveform illustrated in (8) in FIG. 3 by the operation in S1 to S8.

Figure 4:
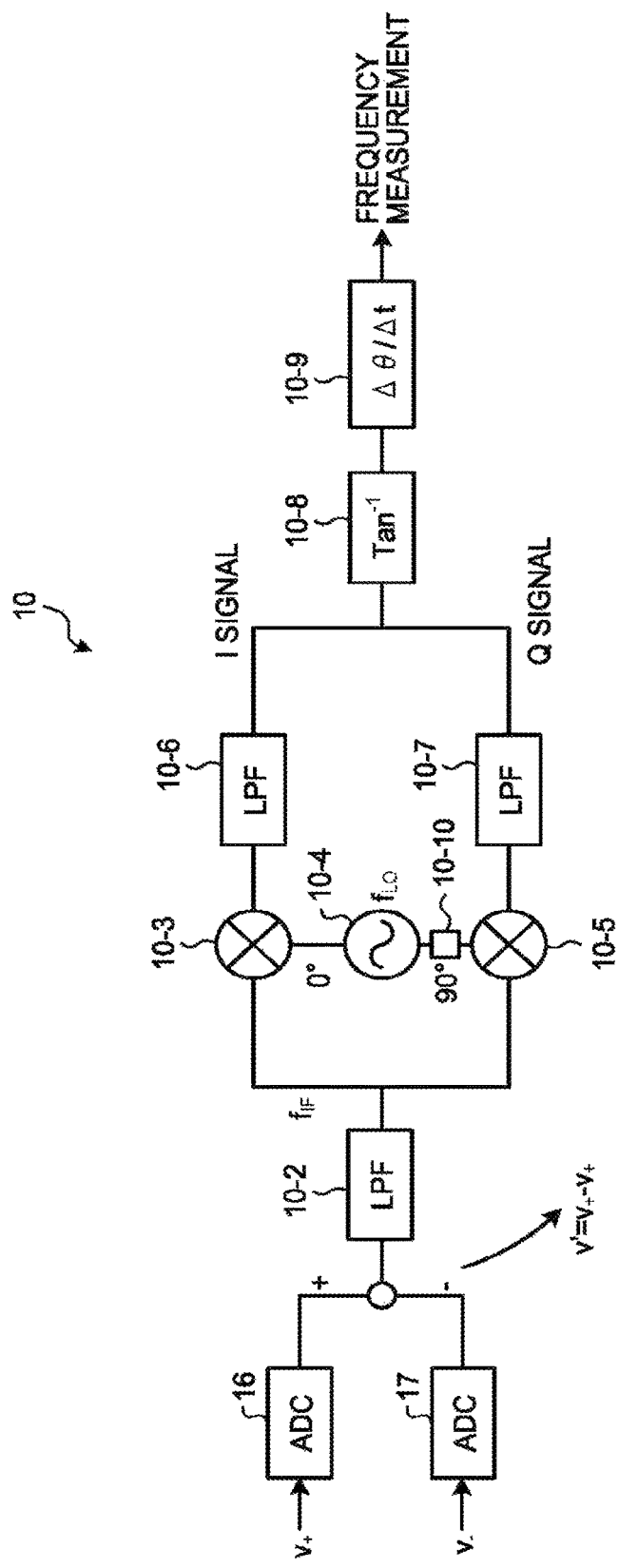
FIG. 4 is a diagram illustrating a configuration for measuring a frequency from phase information according to a quadrature demodulation scheme using an IF signal input to a signal processing circuit illustrated in FIG. 1.

A calculation method for an error time in S5 to S8 in FIG. 2 is explained in detail. FIG. 4 is a diagram illustrating a configuration for measuring a frequency from phase information in accordance with a quadrature demodulation scheme using an IF signal input to the signal processing circuit illustrated in FIG. 1. The ADC 16 and the ADC 17 are equivalent to the ADC 16 and the ADC 17 illustrated in FIG. 1, respectively. After the IF signal is digitized, the microcomputer 10 performs differential arithmetic processing to calculate V'. The microcomputer 10 includes an LPF 10-2, a MIX 10-3, a frequency generating unit 10-4, a MIX 10-5, an LPF 10-6, an LPF 10-7, an instantaneous-phase-difference calculating unit 10-8, an instantaneous-frequency calculating unit 10-9, and a multiplying unit 10-10. Quadrature demodulation processing is performed by the MIX 10-3, the frequency generating unit 10-4, the MIX 10-5, and the multiplying unit 10-10. Specifically, data sampled by the ADC 16 is separated into two signals of an I (In-phase) component and a Q (Quadrature) component according to quadrature detection. In the LPF 10-2 in a first stage, reduction processing for high-frequency and unnecessary wave components of the digitized IF signal is performed. After the multiplying unit 10-10 performs the quadrature detection to thereby separate the IF signal into two signals of an I (In-phase) signal and a Q (Quadrature) signal, the LPFs 10-6 and 10-7 in a second stage reduce a sum frequency component ($f_{IF}+f_{LO}$) generated by multiplication processing and allow only a difference frequency component ($f_{IF}-f_{LO}$) to pass. After an instantaneous phase difference $\Delta\theta=\text{Tan}^{-1}(Q/I)$ of the IF signal is calculated from the I signal and the Q signal by the instantaneous-phase-difference calculating unit 10-8, an instantaneous frequency $f=\Delta\theta/\Delta t$ of the IF signal is calculated by the instantaneous-frequency calculating unit 10-9. $\Delta t$ represents a time step.

Figure 5:
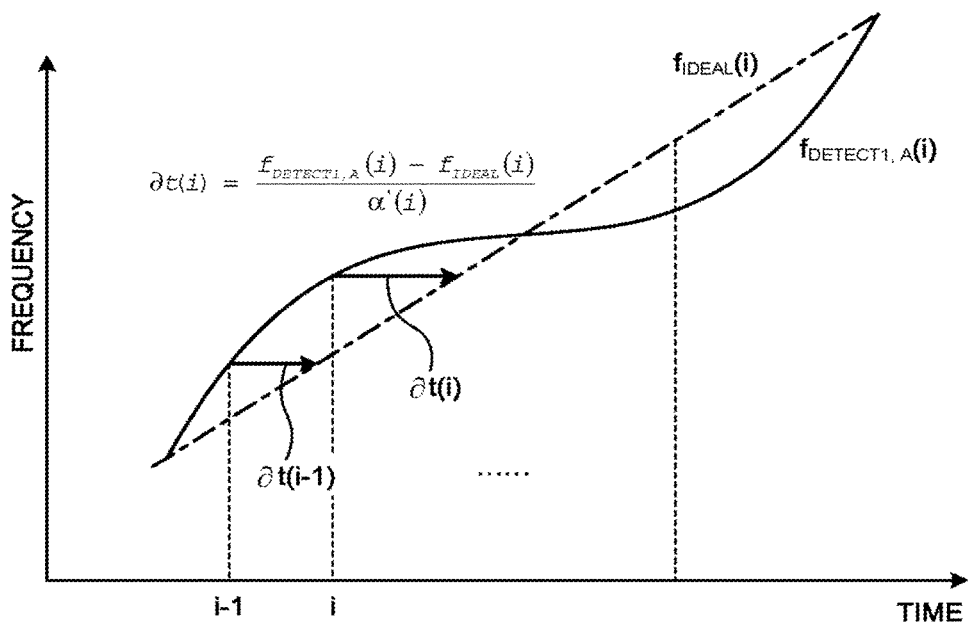
FIG. 5 is a diagram for explaining a time calculating method in the signal processing circuit illustrated in FIG. 1.
Figure 6:
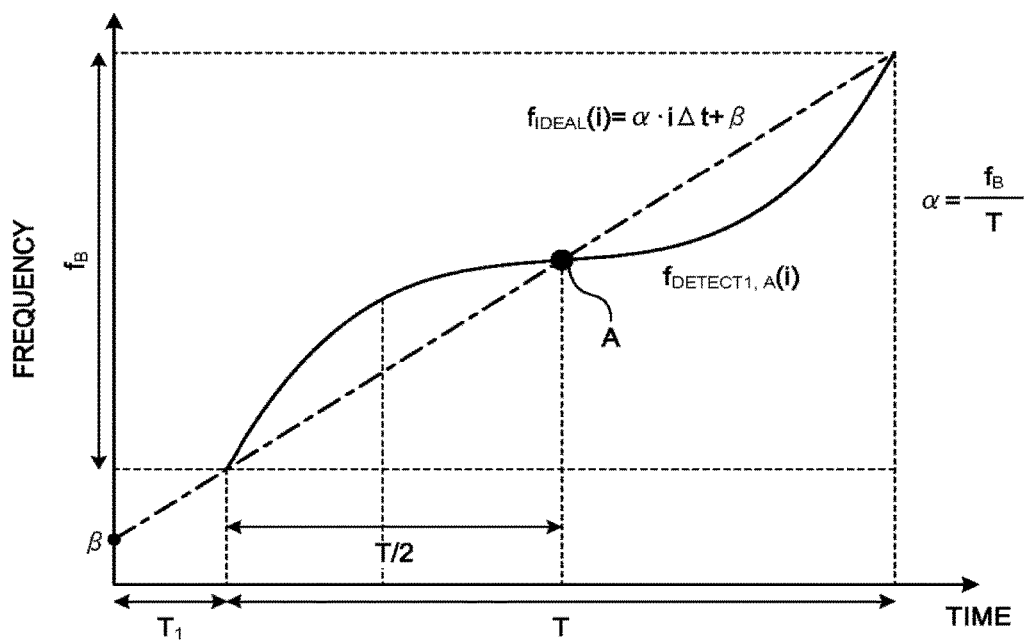
FIG. 6 is a diagram for explaining an ideal-frequency-curve calculating method in the signal processing circuit illustrated in FIG. 1.

FIG. 5 is a diagram for explaining a time calculating method in the signal processing circuit illustrated in FIG. 1. FIG. 6 is a diagram for explaining an ideal-frequency-curve calculating method in the signal processing circuit illustrated in FIG. 1. In each of FIG. 5 and FIG. 6, the horizontal axis indicates time and the vertical axis indicates a frequency.

(1) Frequency Measurement

As illustrated in FIG. 4, an opposite phase-side differential signal $V_+$ output from the single-phase differential converter 18 is input to the ADC 16 and a positive phase-side differential signal $V_-$ is input to the ADC 17. Each of the opposite phase-side differential signal $V_+$ and the positive phase-side differential signal $V_-$ is digitized. Thereafter, differential arithmetic processing is performed by a program of the microcomputer 10. Then, a frequency of the IF signal is measured from phase information according to the quadrature demodulation scheme. Note that, in S2, the same frequency measurement is performed. The time-frequency data measured in S5 is represented as $f_{DECTECT1}(t)$.

A method of calculating a time error with respect to an ideal frequency from $f_{DETECT1}(t)$ is explained below.

(2) Time Error Calculation

The time-frequency data $f_{DETECT1}(t)$ is subjected to the n-th order polynomial approximation in a relation between time and a frequency. Frequency measurement data $f_{DETECT1,A}(t)$ polynomial approximation is indicated by Expression (1) described below. When Expression (1) described below is expanded to i-th discrete data, Expression (2) described below is obtained. In the expressions, $a_n$, $a_{n-1}$, and $a_0$ (n is a natural number) represent coefficients and $\Delta t$ represents a time step.

[Math. 1]

$$f_{DETECT1,A}(t)=a_n t^n+a_{n-1} t^{n-1} \Lambda + a_0 \quad (1)$$

[Math. 2]

$$f_{DETECT1,A}(i)=a_n (i \cdot \Delta t)^n+a_{n-1}(i \cdot \Delta t)^{n-1} \Lambda + a_0 \quad (2)$$

A time error $\partial t(t)$ is calculated from Expression (3) described below. When Expression (3) described below is expanded to i-th discrete data, $\partial t(i)$ indicated by Expression (4) below is obtained.

[Math. 3]

$$\partial t(t) = \frac{f_{DETECT1,A}(t) - f_{IDEAL}(t)}{\alpha'(t)} \quad (3)$$

[Math. 4]

$$\partial t(i) = \frac{f_{DETECT1,A}(i) - f_{IDEAL}(i)}{\alpha'(i)} \quad (4)$$

In Expression (3) described above, $\alpha'(t)$ represents a modulation gradient and is calculated by differentiating $f_{DETECT1,A}$ once. The modulation gradient $\alpha'(t)$ is indicated by Expression (5) described below. When Expression (4) described above is expanded to i-th discrete data, $\alpha'(i)$ indicated by Expression (6) described below is obtained.

[Math. 5]

$$\alpha'(t) = \frac{d(f_{DETECT1,A})}{dt} = n \cdot a_n t^{n-1} + (n-1) \cdot a_{n-1} t^{n-2} \Lambda + a_1 \quad (5)$$

[Math. 6]

$$\alpha'(i) = \frac{d(f_{DETECT1,A})}{dt} = n \cdot a_n \cdot (i \cdot \Delta t)^{n-1} + (n-1) \cdot a_{n-1} \cdot (i \cdot \Delta t)^{n-2} \Lambda + a_1 \quad (6)$$

In Expression (3) described above, $f_{IDEAL}(t)$ represents an ideal frequency curve and is as indicated by Expression (7) described below. When Expression described below is expanded to i-th discrete data, Expression (8) described below is obtained. In Expression (7) and Expression (8) described below, $\alpha$ represents a modulation gradient theoretical value.

[Math. 7]

$$f_{IDEAL}(t)=\alpha t+\beta \quad (7)$$

[Math. 8]

$$f_{IDEAL}(i)=\alpha \cdot (i \cdot \Delta t)+\beta \quad (8)$$

A calculation method for $\beta$ in Expression (7) and Expression (8) described above is explained below. $\beta$ is calculated by resetting $f_{IDEAL}(t)$ from a modulation center point $T1+T/2$ of a frequency measurement result $f_{DETECT1,A}$ to t=0. Specifically, $f_{IDEAL}$ at an A point (T1+T/2) illustrated in FIG. 6 is calculated by Expression (9) described below. A relation of Expression (10) described below holds from a condition that $f_{DETECT1,A}$ and $f_{IDEAL}$ are equal at the A point (T1+T/2). From Expression (10) described below, $\beta$ indicated by Expression (11) described below is calculated.

[Math. 9]

$$f_{IDEAL}\left(T_1 + \frac{T}{2}\right) = \alpha \cdot \left(T_1 + \frac{T}{2}\right) + \beta \quad (9)$$

[Math. 10]

$$f_{DETECT1,A}\left(T_1 + \frac{T}{2}\right) = \alpha \cdot \left(T_1 + \frac{T}{2}\right) + \beta \quad (10)$$

[Math. 11]

$$\beta = f_{DETECT1,A}\left(T_1 + \frac{T}{2}\right) - \alpha \cdot \left(T_1 + \frac{T}{2}\right) \quad (11)$$

The microcomputer 10 calculates any i-th time error $\partial t(i)$ from Expression (2), Expression (8), and Expression (11) described above and additionally corrects the LUT 22 after the inverse function correction using the calculated time error $\partial t(i)$ to obtain high modulation linearity as illustrated in (7) in FIG. 3.

Figure 7:
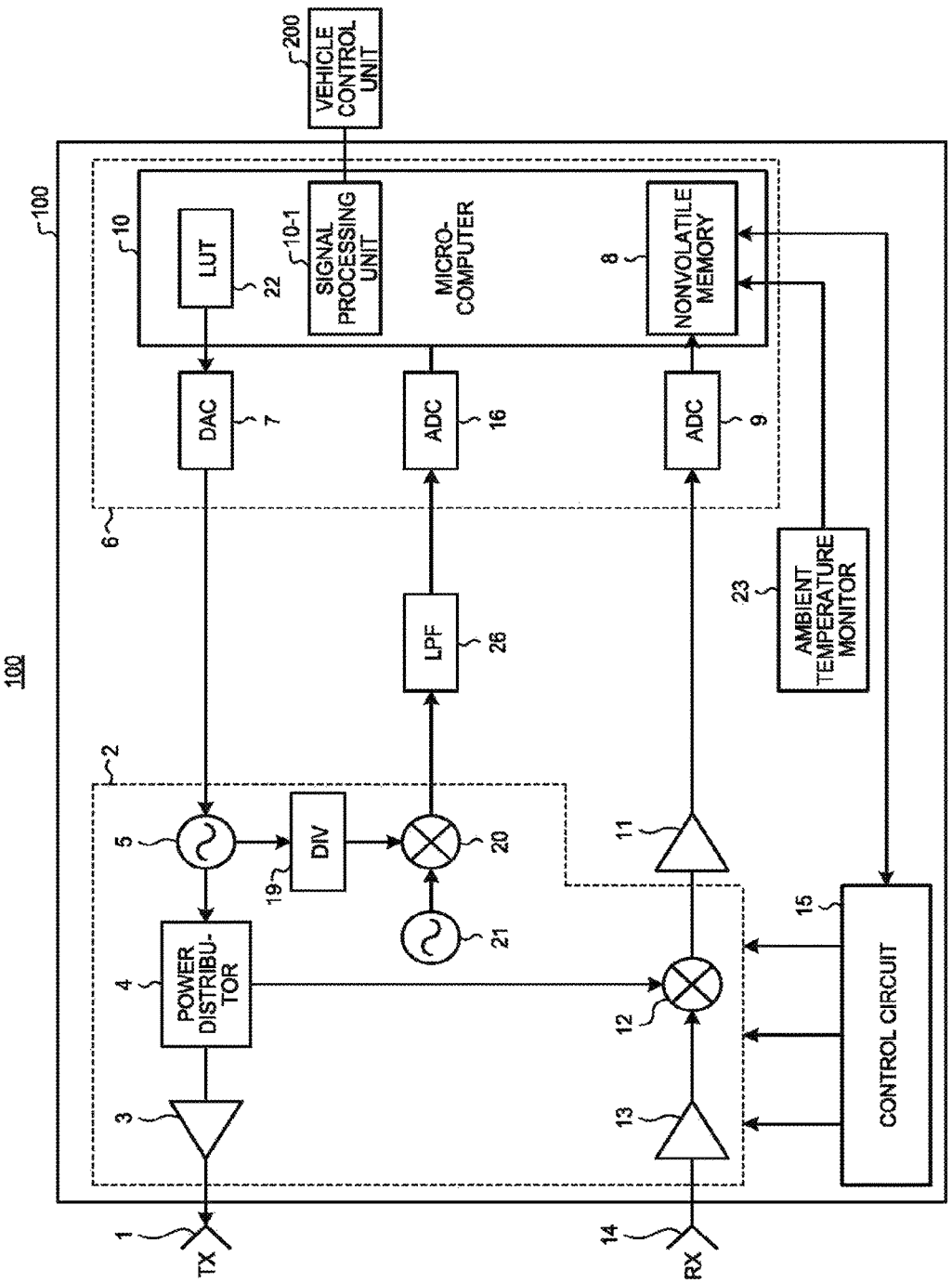
FIG. 7 is a diagram illustrating a comparative example compared with the FM-CW radar according to the embodiment of the present invention.

FIG. 7 is a diagram illustrating a comparative example compared with the FM-CW radar according to the embodiment of the present invention. An FM-CW radar 100 illustrated in FIG. 7 is different in the following points compared with the FM-CW radar 100-1 in the embodiment.

(1) In a frequency modulation circuit 110 of the FM-CW radar 100, a single-phase IF signal output from the MIX 20 is input to an LPF 26.

(2) An output signal of the LPF 26 is input to the ADC 16 in the signal processing circuit 6 and converted into a digital signal.

The microcomputer 10 illustrated in FIG. 7 measures an instantaneous frequency from instantaneous phase information on the IF signal, in accordance with the quadrature demodulation scheme using the signal converted into the digital signal by the ADO 16. The microcomputer 10 calculates an oscillation frequency of the VCO 5 from a frequency and a frequency division number of a local signal source. Time-frequency data measured in the quadrature demodulation scheme is poor in measurement accuracy. High linearity of frequency modulation cannot be obtained by performing feedback-control on the time-frequency data.

After the signal processing circuit 6 performs differential arithmetic processing of the IF signal with a differential arithmetic processing program in accordance with the quadrature demodulation scheme, the FM-CW radar 100-1 according to the embodiment of the present invention measures a frequency from phase information obtained by program execution processing of the microcomputer 10, performs n-th order polynomial (n is an integer equal to or larger than 2) approximation on time-frequency data of the IF signal output based on a modulation control voltage after the correction using inverse function, and performs modulation correction for correcting a time error. Consequently, effects explained below can be obtained.

(1) Frequency Measuring Method

A DC offset, an even order harmonic, and common mode noise included in a signal can be reduced by converting an IF signal of a frequency division that is an output of a VCO into a differential output and performing the differential arithmetic processing with the differential arithmetic processing program of the microcomputer 10. A measurement error during frequency measurement in the quadrature demodulation scheme can be improved. When a differential ADC is used as the ADC 16 illustrated in FIG. 7, not only component cost but also an occupied area of a module configuring the differential ADC increases. However, in the FM-CW radar 100-1 according to this embodiment, the ADCs 16 and 17 corresponding to only a single end can be used. It is possible to reduce component cost and perform highly accurate frequency measurement. Modulation correction accuracy is improved by performing the highly accurate frequency measurement. As a result, the modulation linearity is improved. The distance to the target object and the relative speed can be more accurately calculated. A modulation band of the VCO 5 is wide. Even after the oscillation frequency signal from the VCOS 5 is down-converted into an IF signal, in a low frequency range of the modulation band, in particular, a secondary harmonic component affects the modulation band. It is difficult to suppress the secondary harmonic component with the LPF 26 configured by hardware. However, by performing the differential arithmetic processing, the secondary harmonic component in the low frequency range of the modulation band can be reduced.

In the microcomputer 10, based on a single-phase IF signal output from the MIX 20, an instantaneous frequency f of the IF signal is measured. The instantaneous frequency f of the IF signal is a frequency measured by the instantaneous-frequency calculating unit 10-9 explained above. Concerning a frequency-time waveform of a frequency in a rising modulation period of the IF signal and a frequency in a falling modulation period of the IF signal, the microcomputer 10 performs the modulation correction explained with reference to FIG. 2 and FIG. 3. After the FM-CW radar 100-1 transmits an FM-CW signal generated based on the LUT 22 after the modulation correction and receives a reflected wave from the target object, a reception beat signal down-converted by the MIX 12 is converted into a digital signal by the ADC 9. The reception beat signal converted into the digital signal is subjected to Fast Fourier Transform (FFT) processing and signal processing. A distance to the target object and relative speed are calculated. As a result of the highly accurate frequency measurement of the VCO 5, modulation correction accuracy is improved, the modulation linearity changes to a favorable characteristic, and calculation accuracy of a distance to the target object and relative speed by the FM-CW radar 100-1 is improved.

(2) Time-Error Calculating Method

When the frequency measurement is performed by the quadrature demodulation scheme, a measurement error is caused by noise, a DC offset, and a harmonic component included in the IF signal. Therefore, when a time difference is calculated based on time-frequency data including the measurement error and time error correction is performed, it is difficult to obtain high modulation linearity with the highly accurate modulation correction. According to this embodiment, the measurement error at the frequency measurement can be absorbed by approximating the measurement error with the n-th order polynomial as in Expression (1) described above. Highly accurate modulation correction is enabled by the absorption of the measurement error. In a module of a general FM-CW radar, it can be predicted that a measurement error of a frequency is instantaneously caused by occurrence of vibration, noise, and electromagnetic noise, which are disturbances. However, the measurement error of the frequency cannot be absorbed. According to this embodiment, the instantaneously caused measurement error of the frequency can be absorbed by the n-th order polynomial approximation.

On the other hand, in the VCO 5, a certain fixed error is caused in frequency measurement due to a temperature drift according to a physical property of a semiconductor. Therefore, when an intercept $\beta$ in Expression (7) and Expression (8) described above of an ideal frequency curve is fixed at a theoretical value like the gradient $\alpha$ that is fixed, a correction amount becomes excessive. Accurate modulation correction sometimes cannot be performed in such a case. Therefore, in this embodiment, by using Expression (11) described above, it is possible to prevent the correction amount from becoming excessive. Thus, stable modulation correction is enabled.

Figure 8:
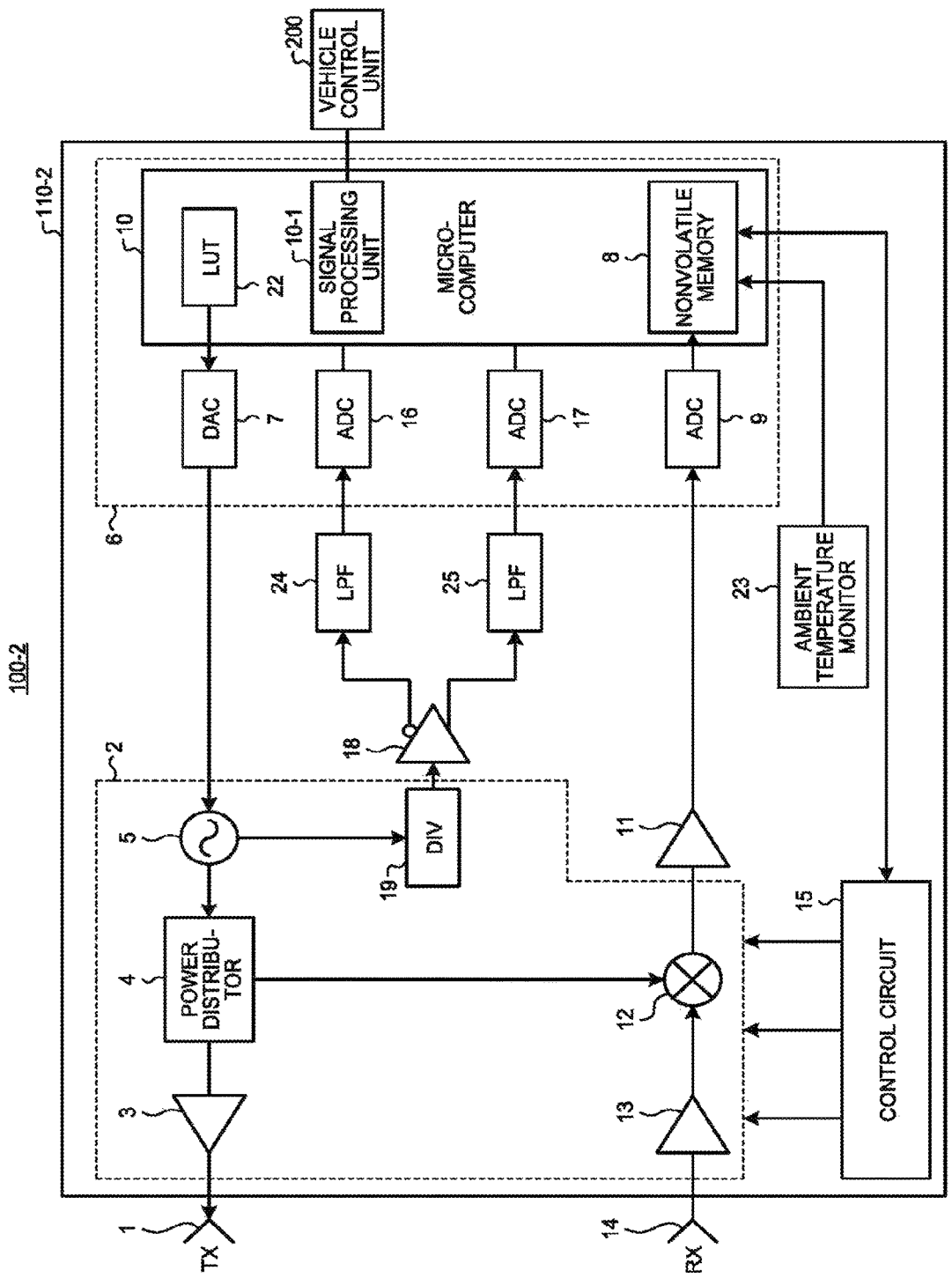
FIG. 8 is a diagram illustrating a first modification of the FM-CW radar according to the embodiment of the present invention.

FIG. 8 is a diagram illustrating a first modification of the FM-CW radar according to the embodiment of the present invention. In a frequency modulation circuit 110-2 of an FM-CW radar 100-2 illustrated in FIG. 8, the reference frequency generator 21 and the MIX 20 illustrated in FIG. 1 are omitted.

The frequency modulation circuit 110-2 includes the DIV 19 that performs frequency division of an oscillation frequency signal of the VCO 5 and outputs the oscillation frequency signal, and the single-phase differential converter 18 that converts a frequency division signal output from the DIV 19 into differential signals and outputs the differential signals. One of the differential signals is input to the LPF 24 and the other of the differential signals is input to the LPF 25.

The microcomputer 10 of the signal processing circuit 6 illustrated in FIG. 8 measures a frequency from phase information of differential signals according to the quadrature demodulation scheme, performs n-th order polynomial (n is an integer equal to or larger than 2) approximation on differential signals output based on a modulation control voltage of default chirp, and performs modulation correction for correcting a time error of the differential signals.

With the frequency modulation circuit 110-2, the reference frequency generator 21 and the MIX 20 illustrated in FIG. 1 are unnecessary. The configuration of the frequency modulation circuit 110-2 is simplified, manufacturing cost can be reduced, and reliability is improved.

Figure 9:
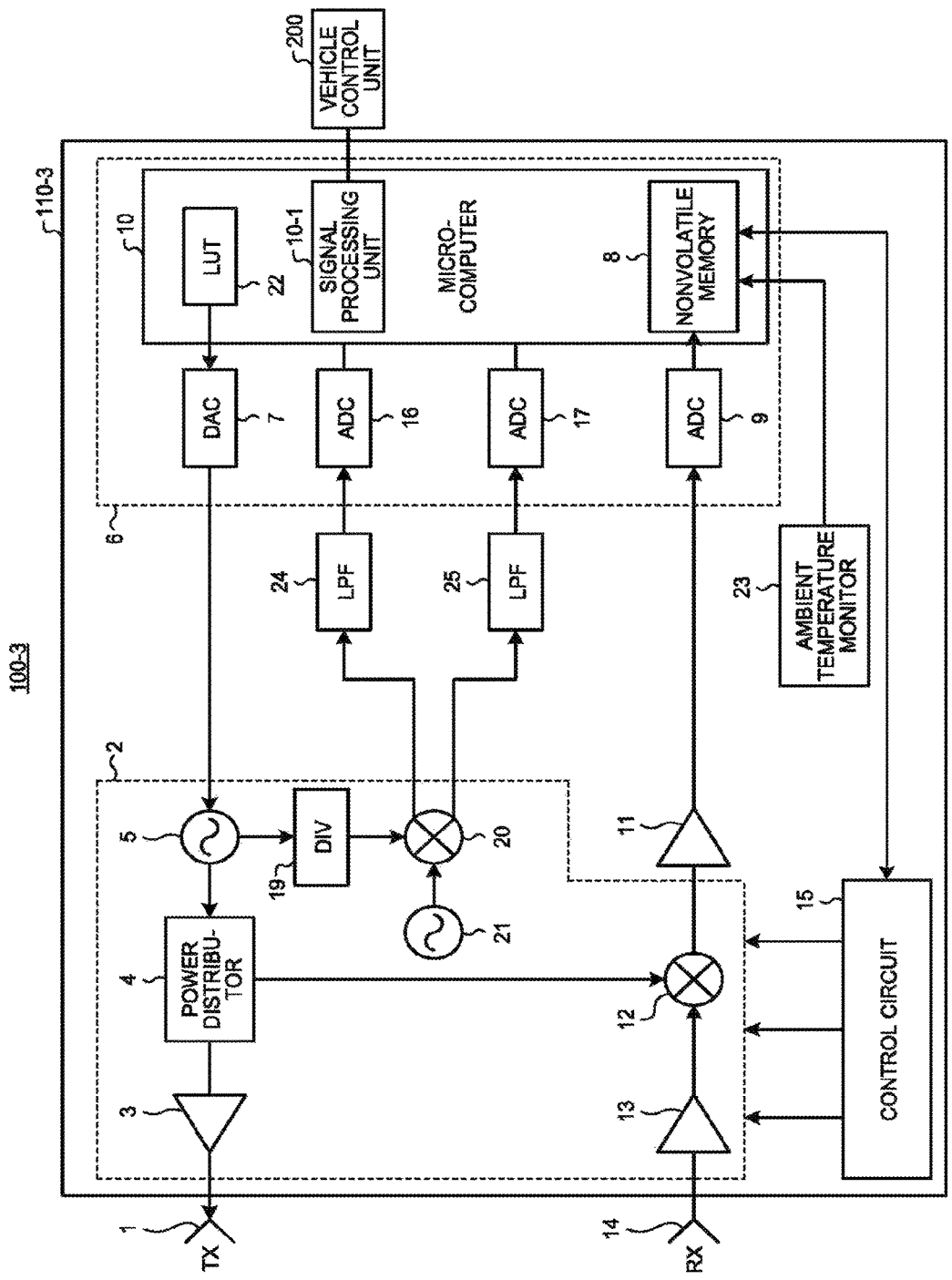
FIG. 9 is a diagram illustrating a second modification of the FM-CW radar according to the embodiment of the present invention.

FIG. 9 is a diagram illustrating a second modification of the FM-CW radar according to the embodiment of the present invention. In a frequency modulation circuit 110-3 of an FM-CW radar 100-3 illustrated in FIG. 9, the single-phase differential converter 18 is omitted.

The frequency-modulation circuit 110-3 includes the DIV 19 and the MIX 20 that down-converts a frequency division signal output from the DIV 19 and converts a single-phase IF signal into differential signals and outputs the differential signals. One of the differential signals is input to the LPF 24 and the other of the differential signals is input to the LPF 25.

The microcomputer 10 of the signal processing circuit 6 illustrated in FIG. 9 measures a frequency from phase information of the IF signal in accordance with the quadrature demodulation scheme, performs n-th order polynomial (n is an integer equal to or larger than 2) approximation on the IF signal output based on a modulation control voltage of default chirp, and performs modulation correction for correcting a time difference of the IF signal.

With the frequency modulation circuit 110-3, the single-phase differential converter 16 illustrated in FIG. 1 is unnecessary. The configuration of the frequency modulation circuit 110-3 is simplified, manufacturing cost can be reduced, and reliability is improved.

Figure 10:
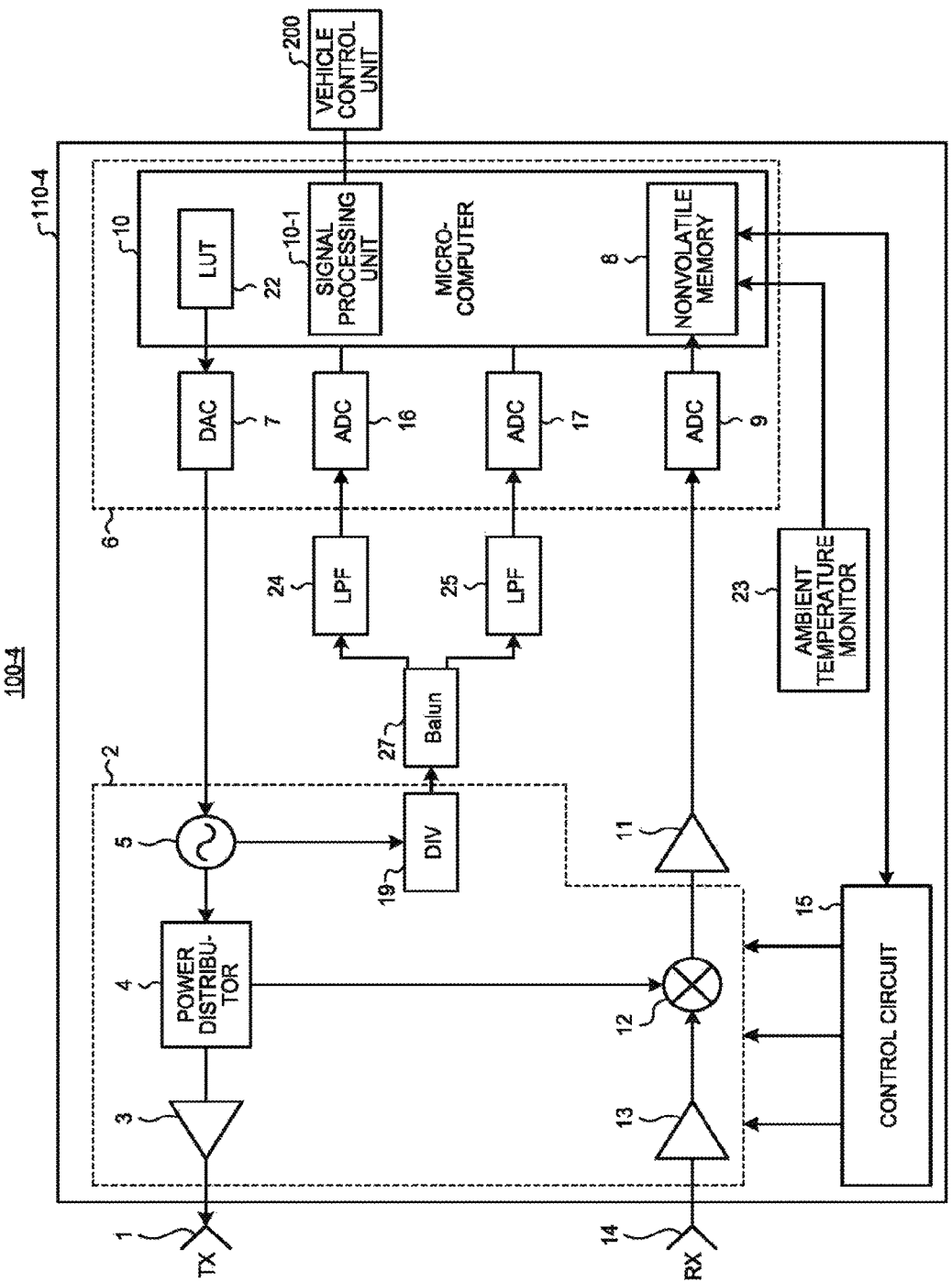
FIG. 10 is a diagram illustrating a third modification of the FM-CW radar according to the embodiment of the present invention.

FIG. 10 is a diagram illustrating a third modification of the FM-CW radar according to the embodiment of the present invention. In a frequency modulation circuit 110-4 of an FM-CW radar 100-4 illustrated in FIG. 10, the MIX 20 and the reference frequency generator 21 illustrated in FIG. 1 are omitted.

The frequency modulation circuit 110-4 includes a Balance unbalanced (Balun) 27, which is a balance-unbalance converter, instead of the single-phase differential converter 18 illustrated in FIG. 1. The Balun 27 converts a single-end frequency division signal output from the DIV 19 into differential signals of a differential type and outputs the differential signals. One of the differential signals is input to the LPF 24 and the other of the differential signals is input to the LPF 25.

The microcomputer 10 of the signal processing circuit 6 illustrated in FIG. 10 measures a frequency from phase information of the differential signals according to the quadrature demodulation scheme, performs n-th order polynomial (n is an integer equal to or larger than 2) approximation on the differential signals output based on a modulation control voltage of default chirp, and performs modulation correction for correcting a time difference of the differential signals.

With the frequency modulation circuit 110-4, the reference frequency generator 21 and the MIX 20 illustrated in FIG. 1 are unnecessary. The configuration of the frequency modulation circuit 110-2 is simplified, manufacturing cost can be reduced, and reliability is improved.

Figure 11:
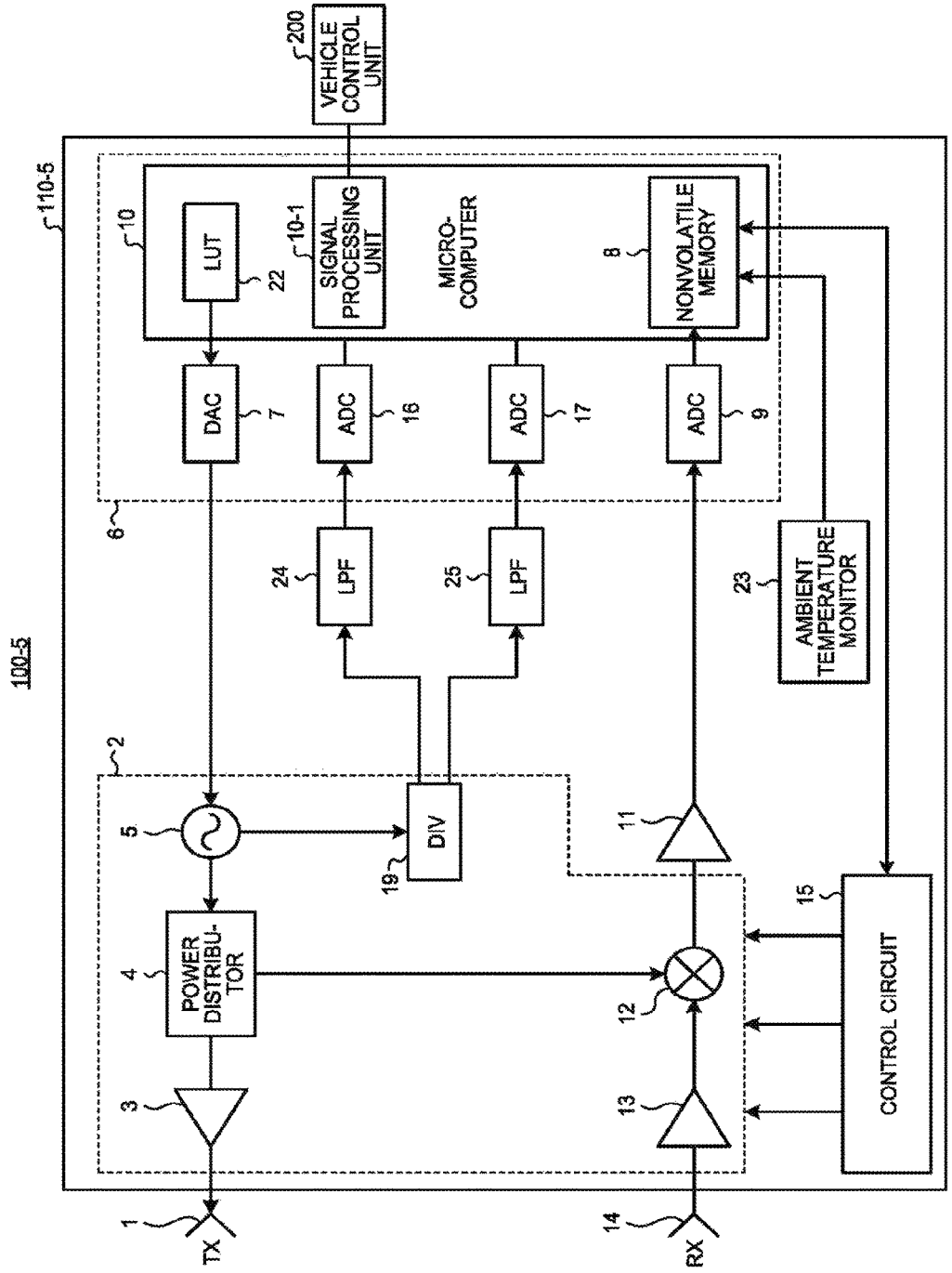
FIG. 11 is a diagram illustrating a fourth modification of the FM-CW radar according to the embodiment of the present invention.

FIG. 11 is a diagram illustrating a fourth modulation of the FM-CW radar according to the embodiment of the present invention. In a frequency modulation circuit 110-5 of an FM-CW radar 100-5 illustrated in FIG. 11, the MIX 20, the reference frequency generator 21, and the single-phase differential converter 18 illustrated in FIG. 1 are omitted.

The DIV 19 of the frequency modulation circuit 110-5 performs frequency division of an oscillation frequency signal of the VCO 5 and converts a frequency division signal into differential signals and outputs the differential signals. One of the differential signals is input to the LPF 24 and the other of the differential signals is input to the LPF 25.

The microcomputer 10 of the signal processing circuit 6 illustrated in FIG. 11 measures a frequency from phase information of the differential signals in accordance with the quadrature demodulation scheme, performs n-th order polynomial (n is an integer equal to or larger than 2) approximation on the differential signals output based on a modulation control voltage of default chirp, and corrects a time difference of the differential signals.

With the frequency modulation circuit 110-5, the MIX 20, the reference frequency generator 21, and the single-phase differential converter 18 illustrated in FIG. 1 are unnecessary. The configuration of the frequency modulation circuit 110-5 is simplified, manufacturing cost can be reduced, and reliability is improved.

Figure 12:
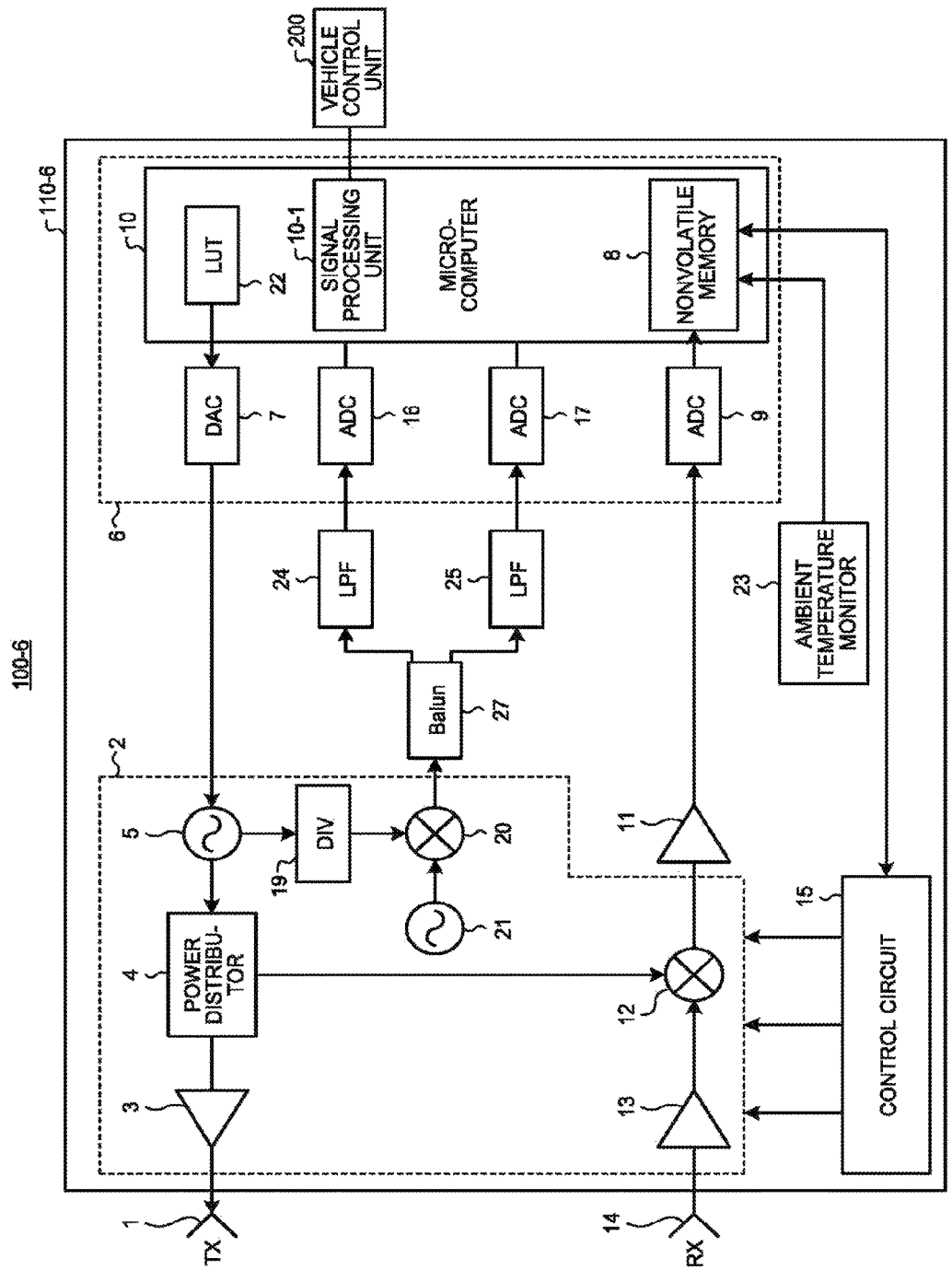
FIG. 12 is a diagram illustrating a fifth modification of the FM-CW radar according to the embodiment of the present invention.

FIG. 12 is a diagram illustrating a fifth modification of the FM-CW radar according to the embodiment of the present invention. A frequency modulation circuit 110-6 of an FM-CW radar 100-6 illustrated in FIG. 12 includes the Balun 27 instead of the single-phase differential converter 18 illustrated in FIG. 1.

The Balun 27 converts a single-phase IF signal output from the MIX 20 into differential signals and outputs the differential signals. One of the differential signals input to the LPF 24 and the other of the differential signals is input to the LPF 25.

The microcomputer 10 of the signal processing circuit 6 illustrated in FIG. 12 measures a frequency from phase information of the IF signal in accordance with the quadrature demodulation scheme, performs n-th order polynomial (n is an integer equal to or larger than 2) approximation on the differential signals output based on a modulation control voltage of default chirp, and performs modulation correction for correcting a time difference of the IF signal.

With the frequency modulation circuit 110-6, it is unnecessary to use the differential ADC and an increase in an occupied area can be reduced as in the frequency modulation circuit 110-1 illustrated in FIG. 1.

Figure 13:
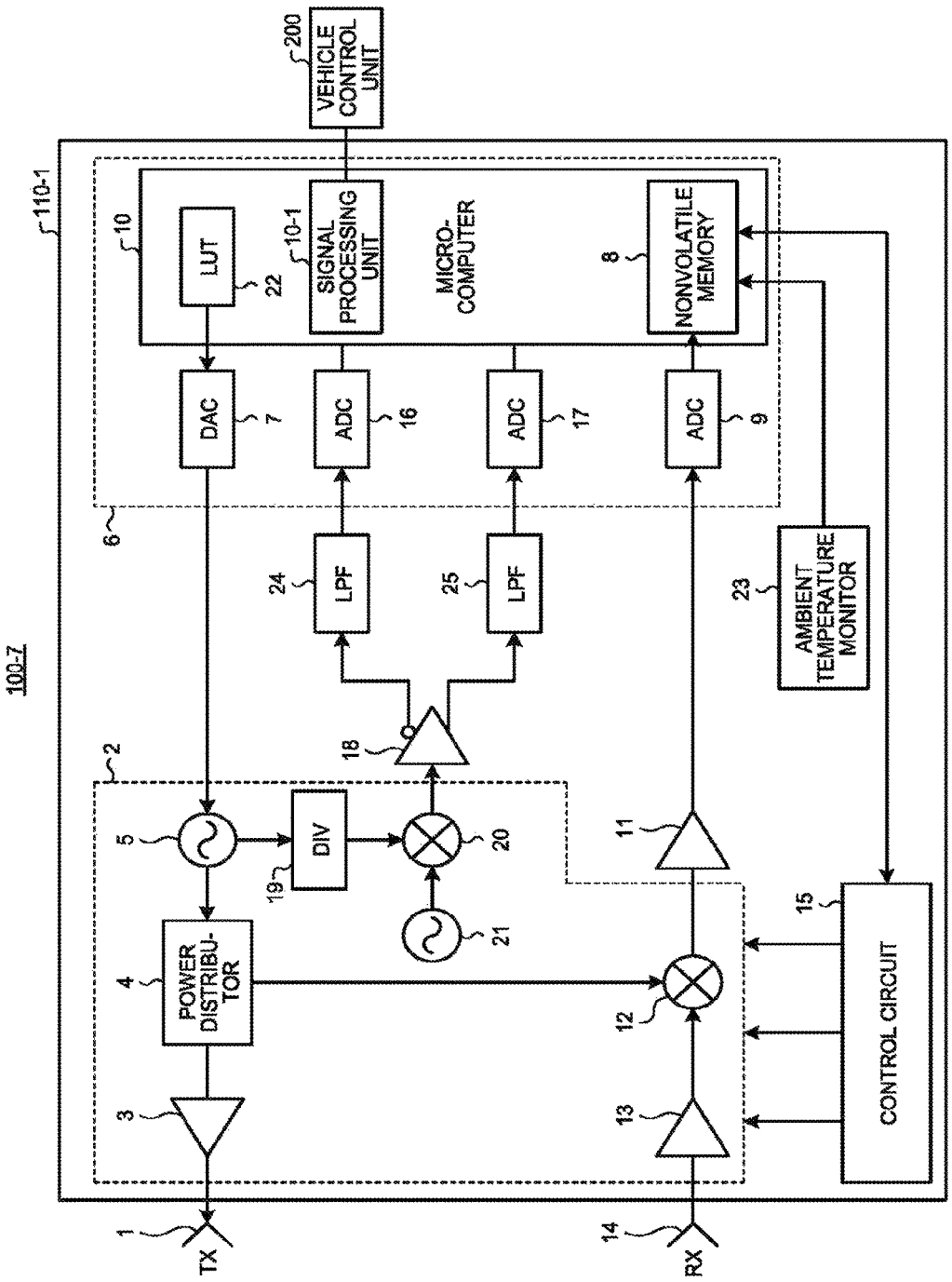
FIG. 13 is a diagram illustrating a high-speed modulation radar according to the embodiment of the present invention.
Figure 14:
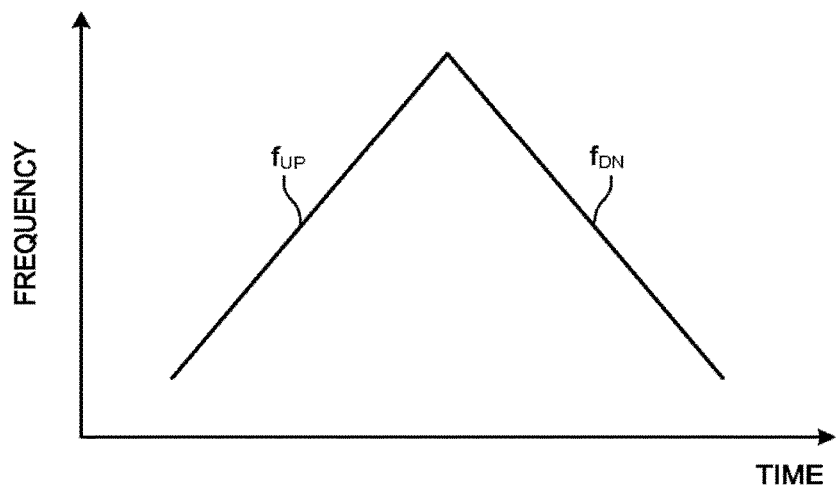
FIG. 14 is a diagram representing frequency specification in the FM-CW radar according to the embodiment of the present invention.
Figure 15:
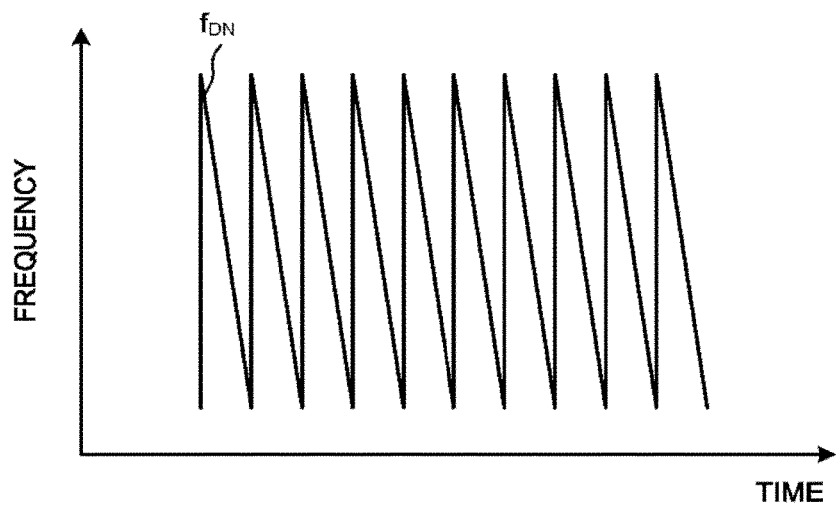
FIG. 15 is a diagram representing frequency specification in a high-speed modulation radar according to the embodiment of the present invention.

The example is explained above in which the frequency modulation circuit according to this embodiment is provided in the FM-CW radar, which is an example of the radar that performs frequency modulation. However, the frequency modulation circuit according to this embodiment can be provided in a high-speed modulation radar. Both of the FM-CM radar and the high-speed modulation radar are radars that perform frequency modulation. However, the FM-CW radar is a radar that performs frequency modulation in a broad sense and the high-speed modulation radar is a radar that performs frequency modulation in a narrow sense. FIG. 13 is a diagram illustrating a high-speed modulation radar according to the embodiment of the present invention. FIG. 14 is a diagram representing frequency specification in the FM-CM radar according to the embodiment of the present invention. FIG. 15 is a diagram representing frequency specification in the high-speed modulation radar according to the embodiment of the present invention.

A difference between the FM-CM radar 100-1 illustrated in FIG. 1 and a high-speed modulation radar 100-7 illustrated in FIG. 13 is that the arithmetic processing in the signal processing unit 10-1 is different. The high-speed modulation radar 100-7 illustrated in FIG. 13 includes the frequency modulation circuit 110-1 illustrated in FIG. 1. However, the high-speed modulation radar 100-7 can include any one of the frequency modulation circuits 110-2 to 110-6 instead of the frequency modulation circuit 110-1. By including any one of the frequency modulation circuits 110-2 to 110-6, the same effects as the effects of the FM-CM radars 100-2 to 100-6 can be obtained. The arithmetic processing in the signal processing unit 10-1 provided in each of the FM-CM radars 100-1 to 100-6 and the high-speed modulation radar 100-7 is explained below.

The vertical axis of FIG. 14 represents a frequency and the horizontal axis of FIG. 14 represents time. The signal processing unit 10-1 of the frequency conversion circuit provided in the FM-CW radars 100-1 to 100-6 selects a combination of an UP frequency $f_{up}$ and a DOWN frequency $f_{DN}$ indicated by Expression (12) and Expression (13), respectively, described below and thereafter solves simultaneous equations to calculate a relative distance to the target object and relative speed. Note that, in Expression (12) and Expression (13) described below, C represents speed of light, B represents a modulation bandwidth, T represents a modulation time, λ represents a wavelength, R represents a relative distance, and v represents relative speed.

[Math. 12]
$$f_{UP} = \frac{B}{T} \cdot \frac{2}{C} \cdot R - \frac{2}{\lambda} V \quad (12)$$

[Math. 13]
$$f_{DN} = \frac{B}{T} \cdot \frac{2}{C} \cdot R + \frac{2}{\lambda} V \quad (13)$$

The vertical axis of FIG. 15 represents a frequency and the horizontal axis of FIG. 15 represents time. The signal processing unit 10-1 of the frequency modulation circuit provided in the high-speed modulation radar 100-7 calculates the relative distance R in accordance with Expression (14) described below. In the high-speed modulation radar 100-7, because chirp speed is high compared with the FM-CW radars 100-1 to 100-6, the item of the relative speed v can be neglected compared with the relative distance R. Therefore, 2v/λ can be regarded as 0. After collecting data for each distance bin, the signal processing unit 10-1 performs doppler processing to calculate the relative speed v.

[Math. 14]
$$f_{DN} = \frac{B}{T} \cdot \frac{2}{C} \cdot R + \frac{2}{\lambda} V \approx \frac{B}{T} \cdot \frac{2}{C} \cdot R \quad (14)$$

In the high-speed modulation radar 100-7, compared with the FM-CW radars 100-1 to 100-6, the modulation time T is different. As the modulation time T of the high-speed modulation radar 100-7, a time equal to or shorter than 1/100 of the modulation time T of the FM-CW radars 100-1 to 100-6 can be exemplary illustrated. Therefore, the FM-CW radars 100-1 to 100-6 can reduce sampling frequencies in the ADCs 16 and 17 compared with the high-speed modulation radar 100-7 and, therefore, can reduce power consumption. The high-speed modulation radar 100-7 has high modulation speed compared with the FM-CW radars 100-1 to 100-6. The high-speed modulation radar 100-7 can increase processing speed of processing such as clutter removal and target identification in the vehicle control unit 200.

The FM-CW radars 100-1 to 100-6 according to this embodiment have high linearity of frequency modulation. Therefore, the FM-CW radars 100-1 to 100-6 can more highly accurately calculate a relative distance to the target object and relative speed. The high-speed modulation radar 100-7 according to this embodiment has high linearity of frequency modulation. Therefore, the high-speed modulation radar 100-7 can more highly accurately calculate relative distance to the target object and relative speed. Further, the high-speed modulation radar 100-7 according to this embodiment has higher distinctiveness compared with the FM-CW radars 100-1 to 100-6. The high-speed modulation radar 100-7 can calculate an actual distance to the target object.

The configuration explained above in the embodiment indicate an example of the content of the present invention. The configuration can be compared with other publicly-known technologies. A part of the configuration can be omitted or changed in a range not departing from the spirit of the present invention.

REFERENCE SIGNS LIST 1 transmission antenna; 2 high-frequency circuit; 3 amplifier; 4 power distributor; 5 VCO; 6 signal processing circuit; 7 DAC; 8 nonvolatile memory; 9, 16, 17 ADC; 10 microcomputer; 10-1 signal processing unit; 10-2, 10-6, 10-7 LPF; 10-3, 10-5, 12, 20 MIX; 10-4 frequency generating unit; 10-8 instantaneous-phase-difference calculating unit; 10-9 instantaneous-frequency calculating unit; 10-10 multiplying unit; 11 baseband amplifier circuit; 13 low-noise amplifier; 14 reception antenna; 15 control circuit; 18 single-phase differential converter; 19 DIV; 21 reference frequency generator; 22 LUT; 23 ambient temperature monitor; 24, 25, 26 LPF; 27 Balun; 100, 100-1, 100-2, 100-3, 100-4, 100-5, 100-6 FM-CW radar; 110, 110-1, 110-2, 110-3, 110-4, 110-5, 110-6 frequency modulation circuit; 100-7 high-speed modulation radar; 200 vehicle control unit.

The invention claimed is:

1. A frequency modulation circuit comprising:
a digital-analog converter to output modulation control time-dependent voltage data;
a voltage control oscillator to oscillate, based on the modulation control time-dependent voltage data output from the digital-analog converter, an oscillation frequency signal;
a frequency divider to perform frequency division of the oscillation frequency signal of the voltage control oscillator and output a frequency division signal;
a frequency converter to down-convert the frequency division signal output from the frequency divider;
a single-phase differential converter to convert an intermediate frequency signal of single-phase output from the frequency converter into differential signals and output the differential signals;
an analog-digital converter to convert, concerning the differential signals output from the single-phase differential converter, analog signals of the differential signals into digital signals; and
a signal processing circuit to perform frequency measurement based on the differential signals of the analog-digital converter, update the modulation control time-dependent voltage data based on the measured frequency, and correct a time error of the oscillation frequency signal of the voltage control oscillator.

2. The frequency modulation circuit according to claim 1, further comprising low-pass filters each of which filters each of the differential signals.

3. The frequency modulation circuit according to claim 1, wherein the signal processing circuit is configured from a microcomputer to store a differential arithmetic processing program using a quadrature demodulation scheme and a memory to store the modulation control time-dependent voltage data, and the signal processing circuit measures time frequency data of the intermediate frequency signal from phase information obtained from execution of the program by the microcomputer using the differential signals output from the analog-digital converter, approximates, with an n-th order polynomial (n is an integer equal to or larger than 2), the time-frequency data of the intermediate frequency signal down-converted by the frequency converter based on the modulation control time-dependent voltage data stored in the memory in advance, corrects, based on a time error calculated from the time frequency data approximated by the n-th order polynomial, the modulation control time-dependent voltage data by correcting the time error from a difference with respect to the modulation control time-dependent voltage data stored in the memory, updates the modulation control time-dependent voltage data of the memory, and corrects the time error of the oscillation frequency signal output from the voltage control oscillator.

4. An FM-CW radar comprising the frequency modulation circuit according to claim 1.

5. A high-speed modulation radar comprising the frequency modulation circuit according to claim 1.

6. A frequency modulation circuit comprising:

a digital-analog converter to output modulation control time-dependent voltage data;

a voltage control oscillator to oscillate, based on the modulation control time-dependent voltage data output from the digital-analog converter, an oscillation frequency signal;

a frequency divider to perform frequency division of the oscillation frequency signal of the voltage control oscillator and output a frequency division signal;

a single-phase differential converter to convert the frequency division signal of single-phase output from the frequency divider into differential signals and output the differential signals;

an analog-digital converter to convert, concerning the differential signals output from the single-phase differential converter, analog signals of the differential signals into digital signals; and a signal processing circuit to perform frequency measurement based on the differential signals of the analog-digital converter, update the modulation control time-dependent voltage data based on a measured frequency, and correct a time error of the oscillation frequency signal of the voltage control oscillator.

7. The frequency modulation circuit according to claim 6, wherein the signal processing circuit is configured from a microcomputer to store a differential arithmetic processing program by a quadrature demodulation scheme and a memory to store the modulation control time-dependent voltage data, and the signal processing circuit measures time-frequency data of the frequency division signal from phase information obtained from execution of the program by the microcomputer using the differential signals output from the analog-digital converter, approximates, with an n-th order polynomial (n is an integer equal to or larger than 2), the time frequency data of the frequency division signal divided by the frequency divider based on the modulation control time-dependent voltage data stored in the memory in advance, corrects, based on a time error calculated from the time frequency data approximated by the n-th order polynomial, the modulation control time-dependent voltage data by correcting the time error from a difference with respect to the modulation control time-dependent voltage data stored in the memory, updates the modulation control time-dependent voltage data of the memory, and corrects the time error of the oscillation frequency signal output from the voltage control oscillator.

8. The frequency modulation circuit according to claim 6, further comprising low-pass filters each of which filters each of the differential signals.

9. An FM-CW radar comprising the frequency modulation circuit according to claim 6.

10. A high-speed modulation radar comprising the frequency modulation circuit according to claim 6.

11. A frequency modulation circuit comprising:

a digital-analog converter to output modulation control time-dependent voltage data;

a voltage control oscillator to oscillate, based on the modulation control time-dependent voltage data output from the digital-analog converter, an oscillation frequency signal;

a frequency divider to perform frequency division of the oscillation frequency signal of the voltage control oscillator and output a frequency division signal;

a frequency converter to down-convert the frequency division signal output from the frequency divider and convert an intermediate frequency signal of single-phase into differential signals and output the differential signals;

an analog-digital converter to convert, concerning the differential signals output from the frequency converter, analog signals of the differential signals into digital signals; and a signal processing circuit to perform frequency measurement based on the differential signals of the analog-digital converter, update the modulation control time-dependent voltage data based on the measured frequency, and correct a time error of the oscillation frequency signal of the voltage control oscillator.

12. The frequency modulation circuit according to claim 11, further comprising low-pass filters each of which filters each of the differential signals.

13. The frequency modulation circuit according to claim 11, wherein the signal processing circuit is configured from a microcomputer to store a differential arithmetic processing program using a quadrature demodulation scheme and a memory to store the modulation control time-dependent voltage data, and the signal processing circuit measures time frequency data of the intermediate frequency signal from phase information obtained from execution of the program by the microcomputer using the differential signals output from the analog-digital converter, approximates, with an n-th order polynomial (n is an integer equal to or larger than 2), the time-frequency data of the intermediate frequency signal down-converted by the frequency converter based on the modulation control time-dependent voltage data stored in the memory in advance, corrects, based on a time error calculated from the time frequency data approximated by the n-th order polynomial, the modulation control time-dependent voltage data by correcting the time error from a difference with respect to the modulation control time-dependent voltage data stored in the memory, updates the modulation control time-dependent voltage data of the memory, and corrects the time error of the oscillation frequency signal output from the voltage control oscillator.

14. An FM-CW radar comprising the frequency modulation circuit according to claim 11.

15. A high-speed modulation radar comprising the frequency modulation circuit according to claim 11.

16. A frequency modulation circuit comprising:
a digital-analog converter to output modulation control time-dependent voltage data;
a voltage control oscillator to oscillate, based on the modulation control time-dependent voltage data output from the digital-analog converter, an oscillation frequency signal;
a frequency divider to perform frequency division of the oscillation frequency signal of the voltage control oscillator and output a frequency division signal;
a balance-unbalance converter to convert the frequency division signal output from the frequency divider into differential signals and output the differential signals;
an analog-digital converter to convert, concerning the differential signals output from the balance-unbalance converter, analog signals of the differential signals into digital signals; and
a signal processing circuit to perform frequency measurement based on the differential signals of the analog-digital converter, update the modulation control time-dependent voltage data based on the measured frequency, and correct a time error of the oscillation frequency signal of the voltage control oscillator.

17. The frequency modulation circuit according to claim 16, further comprising low-pass filters each of which filters each of the differential signals.

18. The frequency modulation circuit according to claim 16, wherein
the signal processing circuit is configured from a microcomputer to store a differential arithmetic processing program by a quadrature demodulation scheme and a memory to store the modulation control time-dependent voltage data, and
the signal processing circuit measures time-frequency data of the frequency division signal from phase information obtained from execution of the program by the microcomputer using the differential signals output from the analog-digital converter, approximates, with an n-th order polynomial (n is an integer equal to or larger than 2), the time frequency data of the frequency division signal divided by the frequency divider based on the modulation control time-dependent voltage data stored in the memory in advance, corrects, based on a time error calculated from the time frequency data approximated by the n-th order polynomial, the modulation control time-dependent voltage data by correcting the time error from a difference with respect to the modulation control time-dependent voltage data stored in the memory, updates the modulation control time-dependent voltage data of the memory, and corrects the time error of the oscillation frequency signal output from the voltage control oscillator.

19. An FM-CW radar comprising the frequency modulation circuit according to claim 16.

20. A high-speed modulation radar comprising the frequency modulation circuit according to claim 16.

21. A frequency modulation circuit comprising:
a digital-analog converter to output modulation control time-dependent voltage data;
a voltage control oscillator to oscillate, based on the modulation control time-dependent voltage data output from the digital-analog converter, an oscillation frequency signal;
a frequency divider to perform frequency division of the oscillation frequency signal of the voltage control oscillator and convert the frequency division signal into differential signals and output the differential signals;
an analog-digital converter to convert, concerning the differential signals output from the frequency divider, analog signals of the differential signals into digital signals; and
a signal processing circuit to perform frequency measurement based on the differential signals of the analog-digital converter, update the modulation control time-dependent voltage data based on the measured frequency, and correct a time error of the oscillation frequency signal of the voltage control oscillator.

22. The frequency modulation circuit according to claim 21, further comprising low-pass filters each of which filters each of the differential signals.

23. The frequency modulation circuit according to claim 21, wherein
the signal processing circuit is configured from a microcomputer to store a differential arithmetic processing program by a quadrature demodulation scheme and a memory to store the modulation control time-dependent voltage data, and
the signal processing circuit measures time-frequency data of the frequency division signal from phase information obtained from execution of the program by the microcomputer using the differential signals output from the analog-digital converter, approximates, with an n-th order polynomial (n is an integer equal to or larger than 2), the time frequency data of the frequency division signal divided by the frequency divider based on the modulation control time-dependent voltage data stored in the memory in advance, corrects, based on a time error calculated from the time frequency data approximated by the n-th order polynomial, the modulation control time-dependent voltage data by correcting the time error from a difference with respect to the modulation control time-dependent voltage data stored in the memory, updates the modulation control time-dependent voltage data of the memory, and corrects the time error of the oscillation frequency signal output from the voltage control oscillator.

24. An FM-CW radar comprising the frequency modulation circuit according to claim 21.

25. A high-speed modulation radar comprising the frequency modulation circuit according to claim 21.

26. A frequency modulation circuit comprising:
a digital-analog converter to output modulation control time-dependent voltage data;

a voltage control oscillator to oscillate, based on the modulation control time-dependent voltage data output from the digital-analog converter, an oscillation frequency signal;

a frequency divider to perform frequency division of the oscillation frequency signal of the voltage control oscillator and output a frequency division signal;

a frequency converter to down-convert the frequency division signal output from the frequency divider and convert the frequency division signal into an intermediate frequency signal;

a balance-unbalance converter to convert the intermediate frequency signal of a single phase output from the frequency converter into differential signals and output the differential signals;

an analog-digital converter to convert, concerning the differential signals output from the balance-unbalance converter, analog signals of the differential signals into digital signals; and a signal processing circuit to perform frequency measurement based on the respective differential signals of the analog-digital converter, update the modulation control time-dependent voltage data based on the measured frequency, and correct a time error of the oscillation frequency signal of the voltage control oscillator.

27. The frequency modulation circuit according to claim 26, further comprising low-pass filters each of which filters each of the differential signals.

28. The frequency modulation circuit according to claim 26, wherein the signal processing circuit is configured from a microcomputer to store a differential arithmetic processing program using a quadrature demodulation scheme and a memory to store the modulation control time-dependent voltage data, and the signal processing circuit measures time frequency data of the intermediate frequency signal from phase information obtained from execution of the program by the microcomputer using the differential signals output from the analog-digital converter, approximates, with an n-th order polynomial (n is an integer equal to or larger than 2), the time-frequency data of the intermediate frequency signal down-converted by the frequency converter based on the modulation control time-dependent voltage data stored in the memory in advance, corrects, based on a time error calculated from the time frequency data approximated by the n-th order polynomial, the modulation control time-dependent voltage data by correcting the time error from a difference with respect to the modulation control time-dependent voltage data stored in the memory, updates the modulation control time-dependent voltage data of the memory, and corrects the time error of the oscillation frequency signal output from the voltage control oscillator.

29. An FM-CW radar comprising the frequency modulation circuit according to claim 26.

30. A high-speed modulation radar comprising the frequency modulation circuit according to claim 26.

* * * * *